United States Patent
Tang et al.

(10) Patent No.: US 9,966,299 B2
(45) Date of Patent: May 8, 2018

(54) INHIBITOR PLASMA MEDIATED ATOMIC LAYER DEPOSITION FOR SEAMLESS FEATURE FILL

(71) Applicant: LAM RESEARCH CORPORATION, Fremont, CA (US)

(72) Inventors: Wei Tang, Fremont, CA (US); Bart Van Schravendijk, Sunnyvale, CA (US); Jun Qian, Fremont, CA (US); Hu Kang, Tualatin, OR (US); Adrien LaVoie, Portland, OR (US); Deenesh Padhi, Sunnyvale, CA (US); David C. Smith, Lake Oswego, OR (US)

(73) Assignee: Lam Research Corporation, Fremont, CA (US)

(*) Notice: Subject to any disclaimer, the term of this patent is extended or adjusted under 35 U.S.C. 154(b) by 0 days. days.

(21) Appl. No.: 15/213,750

(22) Filed: Jul. 19, 2016

(65) Prior Publication Data
US 2016/0329238 A1    Nov. 10, 2016

Related U.S. Application Data

(62) Division of application No. 14/630,852, filed on Feb. 25, 2015, now Pat. No. 9,425,078.
(Continued)

(51) Int. Cl.
| | | |
|---|---|---|
| *H01L 21/762* | (2006.01) | |
| *H01L 21/02* | (2006.01) | |
| *C23C 16/455* | (2006.01) | |
| *C23C 16/52* | (2006.01) | |
| *H01L 21/3205* | (2006.01) | |
| *H01L 21/768* | (2006.01) | |

(Continued)

(52) U.S. Cl.
CPC ........ *H01L 21/76224* (2013.01); *C23C 16/02* (2013.01); *C23C 16/045* (2013.01); *C23C 16/402* (2013.01); *C23C 16/458* (2013.01); *C23C 16/4554* (2013.01); *C23C 16/45527* (2013.01); *C23C 16/45534* (2013.01); *C23C 16/45544* (2013.01); *C23C 16/50* (2013.01); *C23C 16/52* (2013.01); *H01J 37/32082* (2013.01); *H01J 37/32449* (2013.01); *H01L 21/0228* (2013.01); *H01L 21/02164* (2013.01); *H01L 21/02274* (2013.01); *H01L 21/02315* (2013.01); *H01L 21/32051* (2013.01); *H01L 21/76837* (2013.01)

(58) Field of Classification Search
CPC .......................... H01L 21/76224; C23C 16/50
See application file for complete search history.

(56) References Cited

U.S. PATENT DOCUMENTS

| | | | |
|---|---|---|---|
| 7,998,878 B2 | 8/2011 | Levy et al. | |
| 8,883,637 B2 * | 11/2014 | Jeng | .................. H01L 21/28556 438/629 |

(Continued)

*Primary Examiner* — Moazzam Hossain (57) ABSTRACT

Systems and methods for depositing film in a substrate processing system includes performing a first atomic layer deposition (ALD) cycle in a processing chamber to deposit film on a substrate including a feature; after the first ALD cycle, exposing the substrate to an inhibitor plasma in the processing chamber for a predetermined period to create a varying passivated surface in the feature; and after the predetermined period, performing a second ALD cycle in the processing chamber to deposit film on the substrate.

19 Claims, 6 Drawing Sheets

Related U.S. Application Data (60) Provisional application No. 61/944,871, filed on Feb. 26, 2014.

(51) Int. Cl.
*C23C 16/458* (2006.01)
*C23C 16/50* (2006.01)
*C23C 16/02* (2006.01)
*C23C 16/04* (2006.01)
*C23C 16/40* (2006.01)
*H01J 37/32* (2006.01)

(56) References Cited

U.S. PATENT DOCUMENTS

| | | | |
|---|---|---|---|
| 9,611,544 B2* | 4/2017 | LaVoie | C23C 16/045 |
| 2003/0013265 A1 | 1/2003 | Yang et al. | |
| 2003/0082307 A1* | 5/2003 | Chung | C23C 16/34 |
| | | | 427/402 |
| 2003/0170993 A1 | 9/2003 | Nagahara et al. | |
| 2005/0158590 A1 | 7/2005 | Li | |
| 2005/0164464 A1* | 7/2005 | Hecht | C23C 16/045 |
| | | | 438/386 |
| 2006/0240187 A1* | 10/2006 | Weidman | C23C 16/0272 |
| | | | 427/248.1 |
| 2006/0286775 A1* | 12/2006 | Singh | C23C 16/0227 |
| | | | 438/478 |
| 2008/0132050 A1* | 6/2008 | Lavoie | C23C 14/0084 |
| | | | 438/584 |
| 2009/0053893 A1* | 2/2009 | Khandelwal | C23C 16/0281 |
| | | | 438/680 |
| 2009/0081374 A1 | 3/2009 | Yang et al. | |
| 2009/0209101 A1* | 8/2009 | Shinriki | C23C 16/32 |
| | | | 438/686 |
| 2010/0148301 A1 | 6/2010 | Matsuda et al. | |
| 2010/0151676 A1* | 6/2010 | Ritchie | C23C 16/34 |
| | | | 438/660 |
| 2013/0084700 A1 | 4/2013 | Swerts et al. | |
| 2013/0337660 A1 | 12/2013 | Ota et al. | |
| 2014/0065838 A1* | 3/2014 | Ellinger | H01L 29/4908 |
| | | | 438/761 |
| 2015/0093907 A1 | 4/2015 | Yieh et al. | |

* cited by examiner

INHIBITOR PLASMA MEDIATED ATOMIC LAYER DEPOSITION FOR SEAMLESS FEATURE FILL

CROSS-REFERENCE TO RELATED APPLICATIONS

This application is a divisional of U.S. patent application Ser. No. 14/630,852 filed Feb. 25, 2015 (now U.S. Pat. No. 9,425,078, issued on Aug. 23, 2016), which claims the benefit of U.S. Provisional Application No. 61/944,871, filed on Feb. 26, 2014. The entire disclosures of the applications referenced above are incorporated herein by reference.

FIELD

The present disclosure relates to substrate processing systems, and more particularly to substrate processing systems and methods for seamless feature fill.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Shallow trench isolation (STI) provides electrical isolation between individual transistor devices in integrated circuits (ICs). STIs include trenches that are filled with high quality silicon (Si) oxide film. In some applications, an aspect ratio (AR) of the trench can be as high as 8:1 and an opening of the trench may narrow down to about 20 nm. Achieving void free STI fill is important because the film may be subjected to further processing in subsequent integration steps, which can expose the void. In some examples, the void may then be unintentionally filled with conductive material, which can lead to short circuits between different conductors on the chip.

In some applications, STIs are filled with film using high density plasma chemical vapor deposition (HDPCVD). However, for trenches with an AR that is higher than 4:1, it becomes very challenging for HDPCVD oxide to fill the STI without voids, even using a deposition-etch-deposition cyclic process.

Figure 1A:
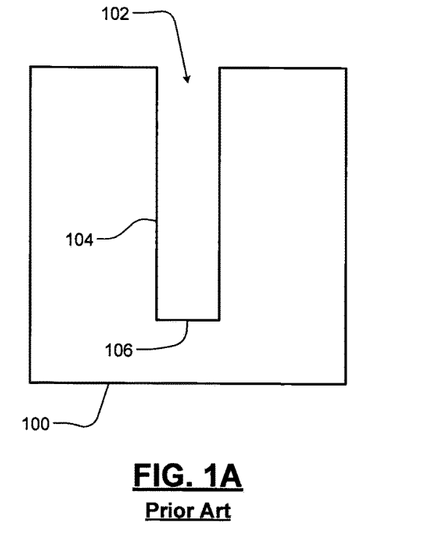
FIGS. 1A-1D illustrate an example of trench gapfill using HDPCVD according to the prior art.
Figure 1B:
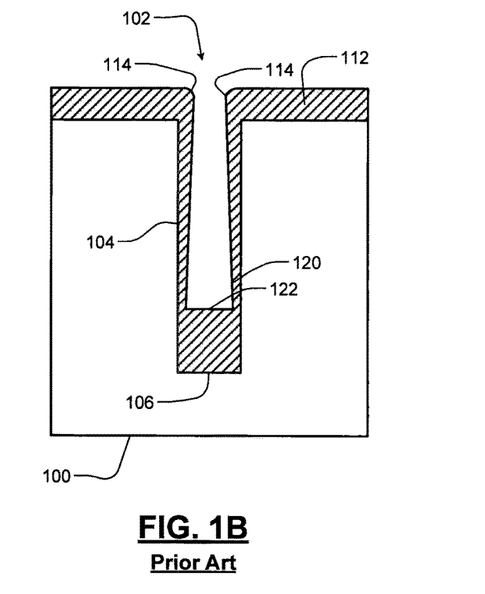
Figure 1C:
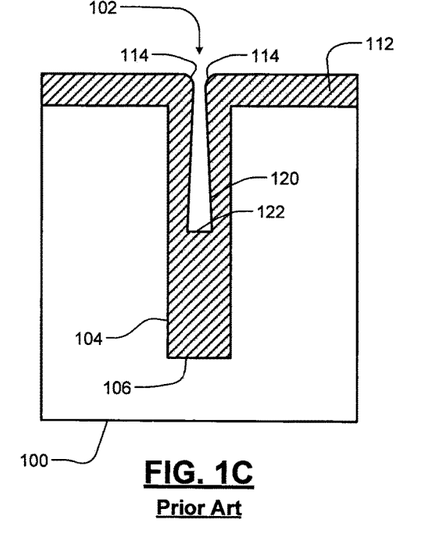
Figure 1D:
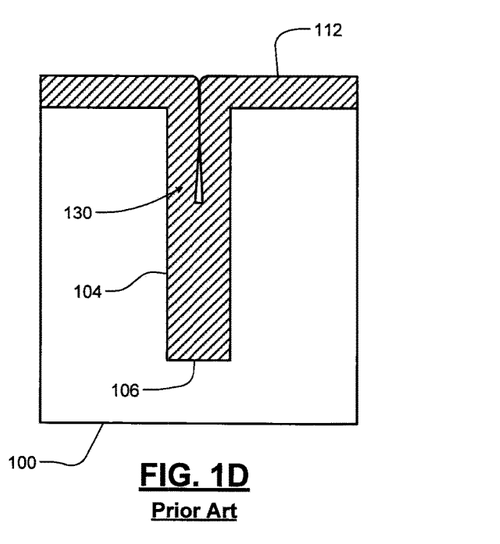

Referring now to FIGS. 1A-1D, an example of gapfill using HDPCVD is shown. In FIG. 1A, a substrate 100 includes a trench 102 having sidewalls 104 and a bottom 106. In FIG. 1B, an oxide layer 112 such as $SiO_2$ is deposited. The oxide layer 112 does not typically have uniform thickness. A cusp 114 usually develops in the trench opening. The oxide layer 112 is usually thinner at lower portions 120 of sidewalls 104 as compared to other locations such as a trench bottom 122 and field region. After additional HDPCVD steps in FIGS. 1C and 1D, the cusps 114 meet at the trench opening and a void 130 is created. The void 130 causes problems during subsequent processing.

While emerging flowable oxide methods provide liquid-like filling behavior, the requirement of flowability limits the achievable film density. Although post-deposition densification methods are available at extra cost, these methods have not proven successful. The alternative methods are not able to densify the film in a high aspect ratio structure due to the constraint of the surrounding sidewalls, which prevents the shrinkage required to fully densify the flowable oxide film.

Figure 2A:
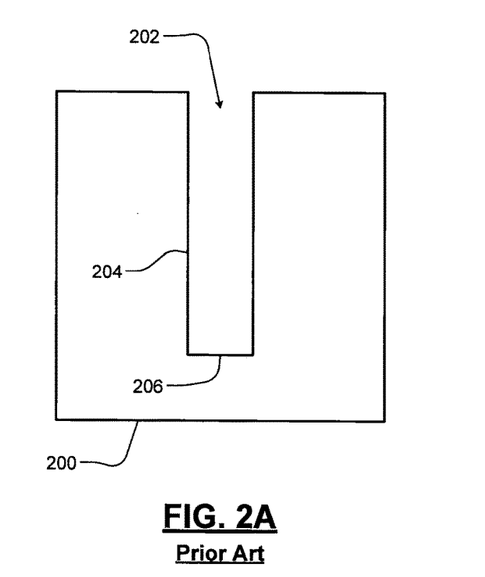
FIGS. 2A-2D illustrate an example of trench gapfill using ALD according to the prior art.
Figure 2B:
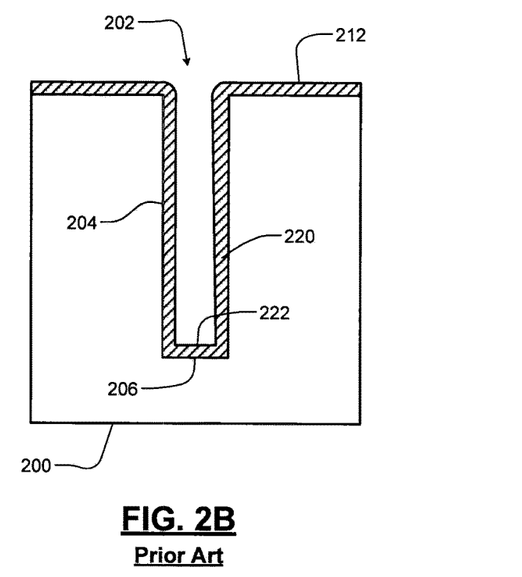
Figure 2C:
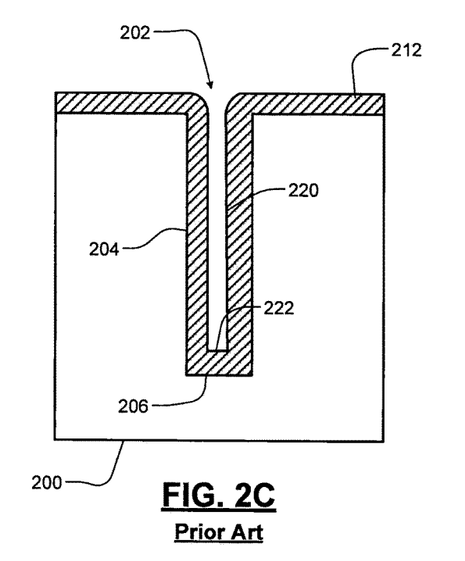
Figure 2D:
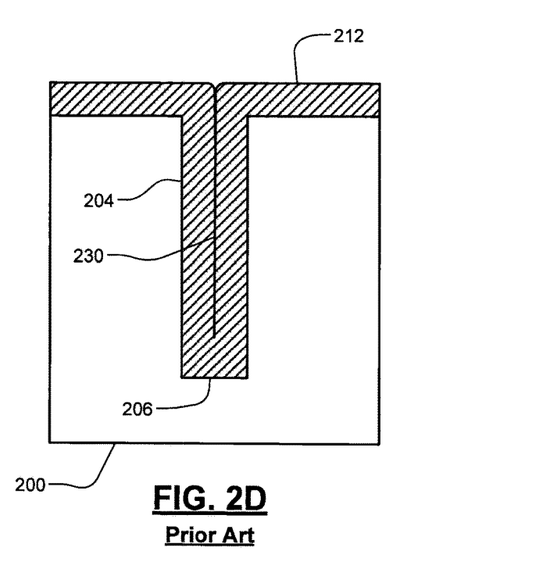

ALD oxide may be used to gapfill deep trenches with high quality Si oxide film. However, a seam usually remains at a center of the trench after the film that is deposited on the side walls merges. Referring now to FIGS. 2A-2D, an example of gapfill using ALD is shown. In FIG. 2A, a substrate 200 includes a trench 202 having sidewalls 204 and a bottom 206. In FIG. 2B, an oxide layer 212 such as $SiO_2$ is deposited during a first ALD cycle. The oxide layer 212 is conformal as can be seen on sidewalls at 220 and at a trench bottom 222. However, after additional ALD cycles in FIGS. 2C and 2D, a seam 230 is created. The seam 230 tends to have a high etch rate during subsequent wet chemical processing.

SUMMARY

This section provides a general summary of the disclosure, and is not a comprehensive disclosure of its full scope or all of its features.

A method for depositing film in a substrate processing system includes performing a first atomic layer deposition (ALD) cycle in a processing chamber to deposit film on a substrate including a feature; after the first ALD cycle, exposing the substrate to an inhibitor plasma in the processing chamber for a predetermined period to create a varying passivated surface in the feature; and after the predetermined period, performing a second ALD cycle in the processing chamber to deposit film on the substrate.

In other features, prior to performing the first ALD cycle, the method includes exposing the substrate to the inhibitor plasma in the processing chamber. The first ALD cycle and the second ALD cycle include exposing the substrate to a first reactant during a first predetermined period; evacuating reactants from the processing chamber after the first predetermined period; exposing the substrate to a second reactant that is different than the first reactant during a second predetermined period; and evacuating reactants from the processing chamber after the second predetermined period.

In other features, the film includes silicon dioxide. Exposing the substrate to the inhibitor plasma includes supplying an inhibitor gas; striking the inhibitor plasma; maintaining the inhibitor plasma for the predetermined period; and after the predetermined period, turning the inhibitor plasma off.

In other features, the inhibitor plasma inhibits subsequent film deposition in an increasing manner in the feature as a depth of the feature decreases. The inhibitor plasma is created using molecular nitrogen as an inhibitor gas.

In other features, the varying passivated surface in the feature improves bottom-up fill of the feature to prevent a seam in the feature. The method further includes exposing the substrate to the inhibitor plasma and performing additional ALD cycles after the second ALD cycle to bottom-up fill the feature without a seam. The inhibitor plasma is created using a gas selected from a group consisting of molecular nitrogen, argon, helium, molecular hydrogen, ammonia or combinations thereof. The feature has an aspect ratio that is greater than 4:1 and an opening that is less than or equal to 30 nanometers.

In other features, the inhibitor plasma is generated using a first plasma source and the first ALD cycle is performed using the first plasma source. The inhibitor plasma is generated using a first plasma source and the first ALD cycle is performed using a second plasma source that is different than the first plasma source. The inhibitor plasma is generated using a first plasma source and the first ALD cycle and the second ALD cycle are performed without using plasma.

In other features, the method includes performing one or more ALD cycles prior to the first ALD cycle without using inhibitor plasma therebetween. The method includes using a process that is different than the first ALD cycle and the second ALD cycle to fill at least part of the feature with a material after performing the first ALD cycle and the second ALD cycle. The first ALD cycle and the second ALD cycle deposit dielectric film. The material includes another dielectric film that is different than the dielectric film. The material includes metal. The feature includes a trench. The feature includes a hole.

A substrate processing system for depositing film includes a processing chamber including a pedestal configured to support a substrate including a feature. A gas supply is configured to selectively supply atomic layer deposition (ALD) process gas to the processing chamber and to selectively supply inhibitor gas to the processing chamber. A plasma generator is configured to selectively generate inhibitor plasma in the processing chamber. A controller is configured to control the gas supply and the plasma generator. The controller is further configured to perform a first ALD cycle in the processing chamber to deposit film on the substrate; after the first ALD cycle, expose the substrate in the processing chamber to the inhibitor plasma generated using the inhibitor gas for a predetermined period to create a varying passivated surface in the feature; and after the predetermined period, perform a second ALD cycle in the processing chamber to deposit film on the substrate.

In other features, the controller is configured to expose the substrate to the inhibitor plasma prior to performing the first ALD cycle. During the first ALD cycle and the second ALD cycle, the controller is configured to expose the substrate to a first reactant for a first predetermined period; evacuate reactants from the processing chamber after the first predetermined period; expose the substrate to a second reactant that is different than the first reactant for a second predetermined period; and evacuate reactants from the processing chamber after the second predetermined period.

In other features, the film includes silicon dioxide. When exposing the substrate to the inhibitor plasma, the controller is configured to supply an inhibitor gas; strike the inhibitor plasma; maintain the inhibitor plasma for the predetermined period; and after the predetermined period, turn the inhibitor plasma off.

In other features, the inhibitor plasma inhibits subsequent film deposition in an increasing manner in the feature as a depth of the feature decreases. The inhibitor plasma is created using molecular nitrogen as the inhibiting gas. The varying passivated surface in the feature improves bottom-up fill of the feature to prevent a seam in the feature. The controller is further configured to expose the substrate to the inhibitor plasma and perform additional ALD cycles after the second ALD cycle to bottom-up fill the feature without a seam.

In other features, the inhibitor gas is selected from a group consisting of molecular hydrogen, ammonia or combinations thereof. The feature has an aspect ratio that is greater than 4:1 and an opening that is less than or equal to 30 nanometers.

Further areas of applicability will become apparent from the description provided herein. The description and specific examples in this summary are intended for purposes of illustration only and are not intended to limit the scope of the present disclosure.

BRIEF DESCRIPTION OF DRAWINGS

In the drawings, reference numbers may be reused to identify similar and/or identical elements.

DESCRIPTION

The present disclosure describes systems and methods for filling features on a substrate. In some examples, the features are formed below a field region of the substrate. In some examples, a seam that is formed in a hole or trench (such as a shallow trench insulator (STI)) during gapfill is eliminated using an atomic layer deposition (ALD) process. While STI applications are disclosed, the present disclosure applies to other applications requiring feature fill such as, but not limited to, pre-metal dielectric, 3D NAND, deep trenches, etc. The systems and methods described herein enhance bottom-up feature fill during the ALD process by exposing the substrate to inhibitor plasma between at least some ALD cycles performed during feature fill.

In some examples, the feature is substantially filled by the ALD cycles. In other examples, the feature is not completely filled by the ALD cycles and other material is used to fill the feature. Examples of other materials include metal or dielectric having a different composition.

The inhibitor plasma creates a passivated surface and increases a nucleation barrier of the deposited ALD film. When the inhibitor plasma interacts with material in the feature, the material at the bottom of the feature receives much less plasma treatment than material located closer to a top portion of the feature or the field because of the geometrical shadowing effect. As a result, deposition at the feature top is selectively inhibited and deposition in lower portions of the feature proceeds with less inhibition or without being inhibited. As a result, bottom-up fill is enhanced, which creates a more favorable sloped profile that mitigates the seam effect.

In some examples, molecular nitrogen ($N_2$) may be used as the source gas for the inhibitor plasma, particularly when the deposited film is $SiO_2$. As can be appreciated, ALD $SiO_2$ nucleates at a slower rate on a nitride surface. In other examples, the inhibitor plasma source gas is selected from a group consisting of $N_2$, argon (Ar), helium (He), molecular hydrogen ($H_2$), ammonia ($NH_3$), or combinations thereof.

The systems and methods described herein enable ALD Si oxide process to be used in STI or other applications. The ALD oxide process with $N_2$ inhibitor plasma is capable of filling much more difficult structures such as those with higher AR or narrower feature sizes as compared to HDP-CVD oxide due to the nature of conformal deposition. In some examples, the AR is greater than or equal to 4:1, 6:1, or 8:1. In some examples, the feature opening is less than or equal to 30 nm, 25 nm or 20 nm. Compared to the flowable oxide process, the ALD oxide process with inhibitor plasma provides improved film quality in terms of wet etch resistance and break down behavior.

Figure 3:
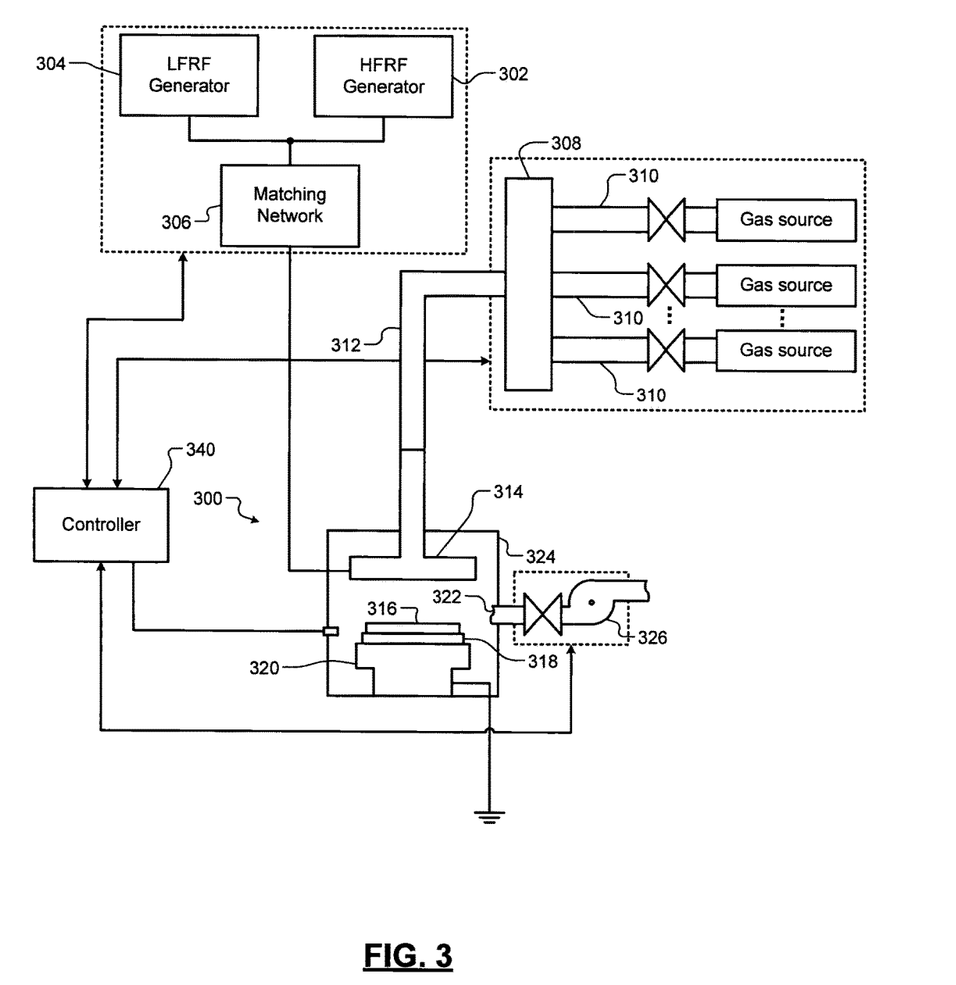
FIG. 3 is a functional block diagram of an example of a substrate processing system for trench gapfill according to the present disclosure.

Referring now to FIG. 3, an example of a system 300 for performing ALD deposition is shown. The system 300 includes a process chamber 324 that encloses other components of the system 300 and contains the RF plasma. The RF plasma may be generated by a capacitive-type plasma generator. For example, a showerhead 314 may be connected to an RF lead and a heater block 320 may be grounded or vice versa. Alternately, other types of plasma generators may be used such as inductive-type plasma generators or remote plasma generators such as a plasma tube. In this example, a high-frequency RF generator 302 and a low-frequency RF generator 304 are connected to a matching network 306 and to the showerhead 314. The power and frequency supplied by matching network 306 is sufficient to generate RF plasma from the process gas.

A pedestal 318 supports a substrate 316. The pedestal 318 typically includes a chuck, a fork, or lift pins to hold and transfer the substrate during and between the deposition and/or plasma treatment reactions. The chuck may be an electrostatic chuck, a mechanical chuck or other type of chuck. The process gases are introduced via inlet 312. Multiple source gas lines 310 are connected to a manifold 308. The gases may be premixed or not. Appropriate valves and mass flow control mechanisms are employed to ensure that the correct gases are delivered during the deposition and plasma treatment phases of the process.

Process gases exit chamber 324 via an outlet 322. A vacuum pump 326 draws process gases out and maintains a suitably low pressure within the system by a flow restriction device, such as a throttle valve or a pendulum valve. A controller 340 may be provided to monitor process parameters and to control a gas mixture, plasma, pedestal heating, chuck and/or removal of reactants from the process chamber.

In some examples, the ALD cycles may include plasma-enhanced ALD (PEALD). If PEALD is used, the plasma sources for the ALD cycles and the inhibition plasma may be the same plasma source. In other examples, different plasma sources may be used. It may be desirable to have some directionality for the inhibitor plasma whereas it may be desirable for the deposition source to have little or no directionality. In other words there could be two plasma sources, or one common plasma source, or one plasma source only for the inhibitor plasma.

Figure 4:
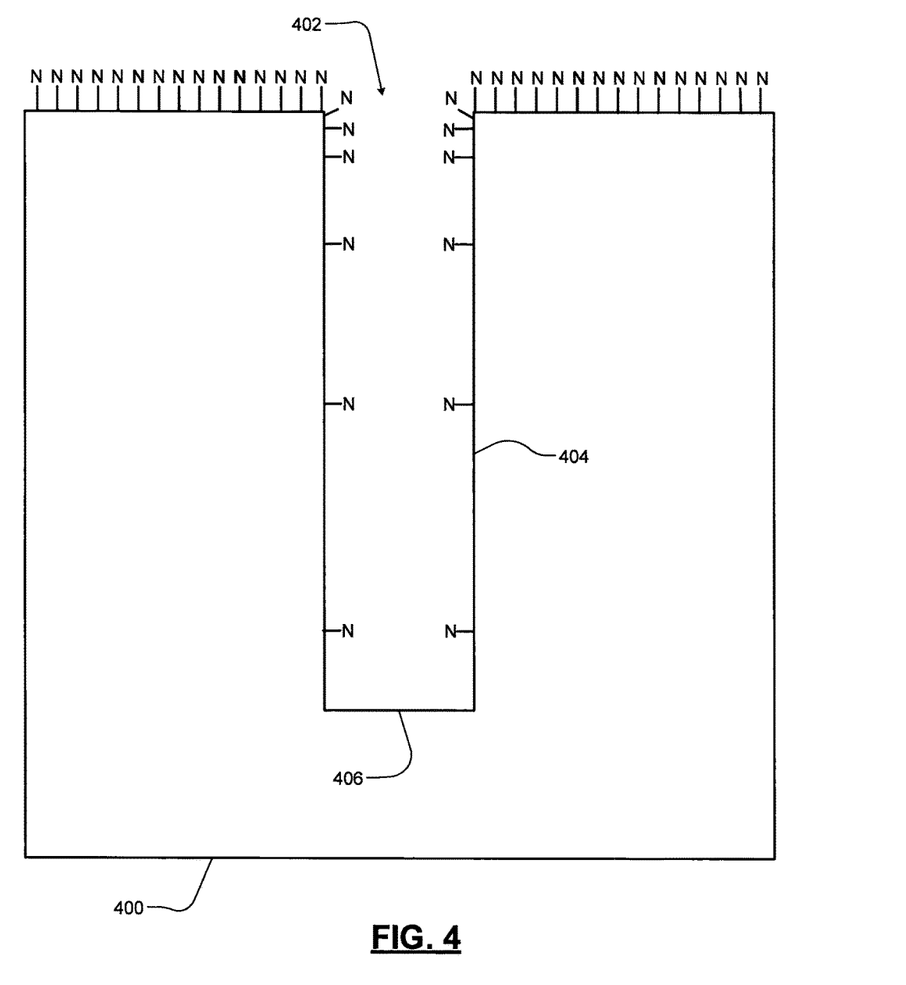
FIG. 4 illustrates directional bombardment of a substrate with an inhibitor plasma.

Referring now to FIG. 4, prior to initiating ALD and/or between at least two successive ALD cycles, the systems and methods according to the present disclosure expose a substrate 400 to inhibitor plasma. The inhibitor plasma enhances bottom-up gapfill and improves high wet etch rate resistance. The inhibitor plasma creates a passivated surface and increases a nucleation barrier of deposited ALD films. When the inhibitor plasma interacts with material in a feature 402, the material at a bottom 406 of the feature 402 receives much less plasma treatment than material located closer to a top portion of the feature or the field because of the geometrical shadowing effect. As a result, deposition at the top of the feature is selectively inhibited and deposition in lower portions of the feature proceeds with less inhibition (e.g. along sidewalls 404) or without being inhibited (e.g. at the bottom 406). As a result, bottom-up fill is enhanced, which creates a more favorable sloped profile that mitigates the seam effect.

As can be seen in FIG. 4, the passivated surface created by the inhibitor plasma is enhanced in the field and upper feature regions and decreases as a distance into the feature increases. As can be appreciated, a similar pattern is created by the inhibitor plasma on the deposited layer after each of the subsequent ALD cycles. In this way, deposition at the feature top is selectively inhibited and deposition in other portions of the feature proceeds with less inhibition or without being inhibited. As a result, bottom-up fill is enhanced, which creates a more favorable sloped profile that mitigates the seam effect.

Figure 5A:
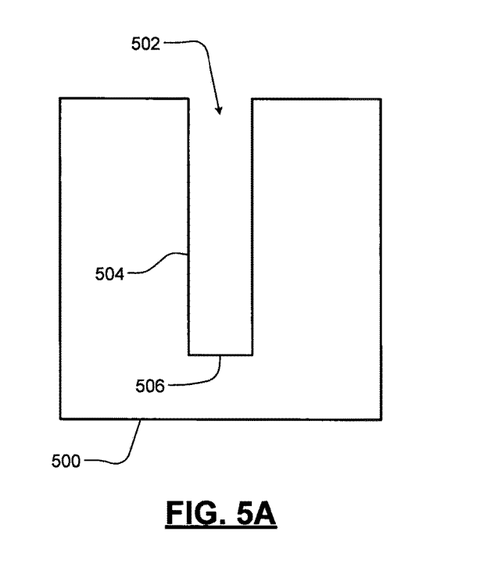
FIGS. 5A-5D illustrate an example of trench gapfill a using ALD and inhibitor plasma according to the present disclosure.
Figure 5B:
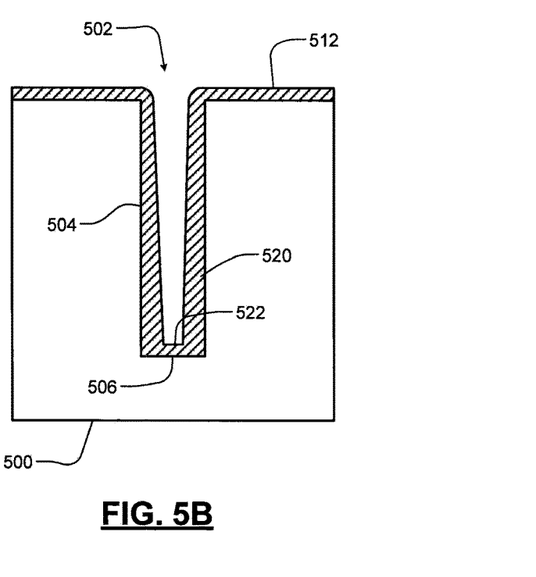
Figure 5C:
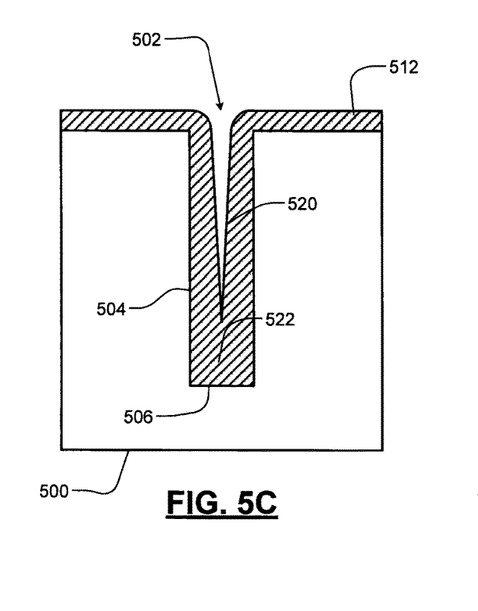
Figure 5D:
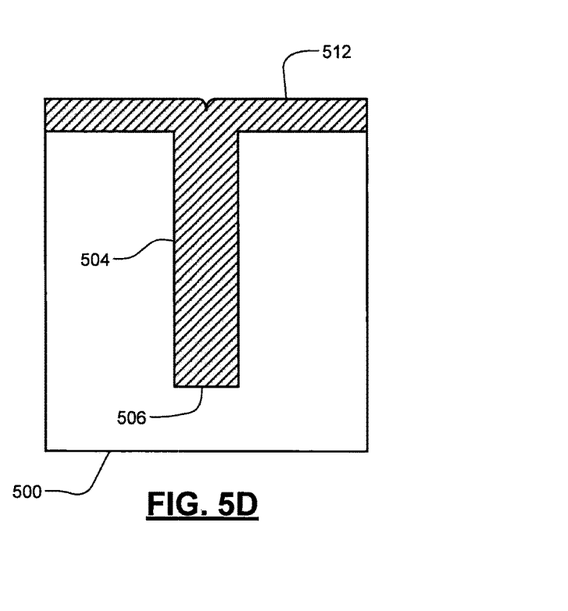

Referring now to FIGS. 5A-5D, an example of gapfill using ALD with inhibitor plasma according to the present disclosure is shown. In FIG. 5A, a substrate 500 includes a feature 502 having sidewalls 504 and a bottom 506. The substrate 500 may be treated with the inhibitor plasma before a first ALD cycle. FIG. 5B shows an oxide layer 512 such as $SiO_2$ that is deposited by the first ALD cycle. More film is deposited at a feature bottom 522 and lower portions 520 of sidewalls 504. The oxide layer 512 has a reduced thickness in areas such as the field and a thickness that increases with a depth in the feature 502. After additional ALD cycles shown in FIGS. 5C and 5D, gapfill of the substrate 500 is completed without a seam.

Figure 6:
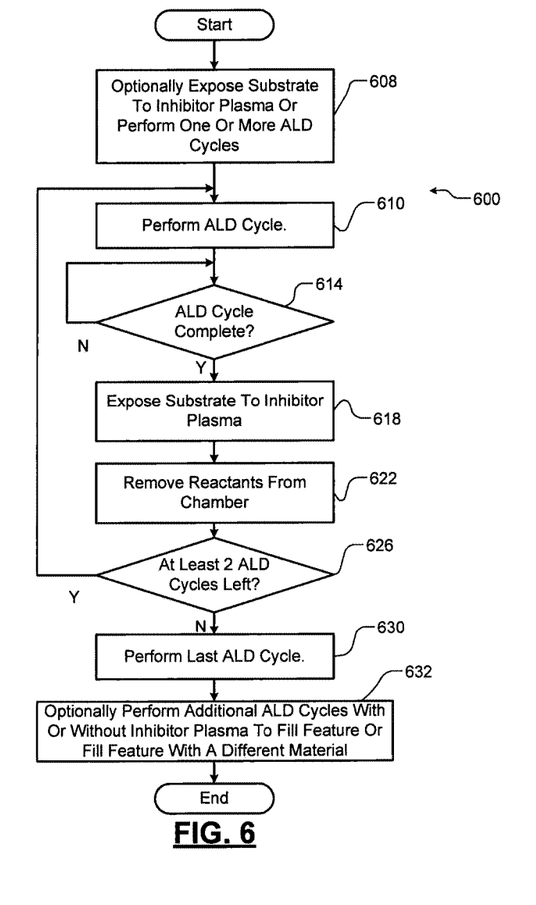
FIGS. 6 and 7 illustrate examples of a method for trench gapfill using ALD and inhibitor plasma.

Referring now to FIG. 6, an example of an ALD method 600 with inhibitor treatment is shown. At 608, the substrate is optionally exposed to inhibitor plasma prior to a first ALD cycle or one or more ALD cycles are performed without inhibitor plasma. At 610, an ALD cycle is performed. In some examples, each ALD cycle may include exposure to a first reactant for a first predetermined period, removal of reactants after the first predetermined period by purging or evacuation, exposure to a second reactant for a second predetermined period and removal of reactants after the second predetermined period by purging or evacuation. If the preceding ALD cycle is complete at 614, then the substrate is exposed to the inhibitor plasma at 618. At 622, reactants are optionally removed from the processing chamber by purging or evacuation. At 626, if there are at least two ALD cycles remaining, the process repeats at 610. Otherwise, the process continues at 630 and completes a last ALD cycle. At 632, additional ALD cycles are optionally performed without inhibitor plasma to fully or partially fill the feature and/or at least part of the feature can be filled with a different material.

Figure 7:
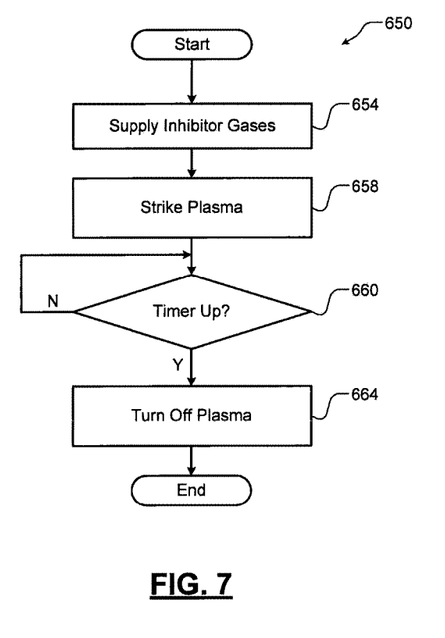

Referring now to FIG. 7, an example of a method 650 for supplying inhibitor plasma is shown. At 654, inhibitor gases are supplied to the processing chamber. At 658, plasma is struck in the chamber. At 660, when a timer is up, control turns off the plasma at 664. As can be appreciated, the plasma may be generated in a different manner. If PEALD is used, a similar method is used to strike plasma although plasma process gas is supplied instead of inhibitor gas at 654.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory (such as flash memory), volatile memory (such as static random access memory and dynamic random access memory), magnetic storage (such as magnetic tape or hard disk drive), and optical storage.

The apparatuses and methods described in this application may be partially or fully implemented by one or more computer programs executed by one or more processors. The computer programs include processor-executable instructions that are stored on at least one non-transitory, tangible computer-readable medium. The computer programs may also include and/or rely on stored data.

What is claimed is:

1. A substrate processing system for depositing film, comprising:
    a processing chamber including a pedestal configured to support a substrate including a feature;
    a gas source configured to selectively supply atomic layer deposition (ALD) process gas to the processing chamber via at least one gas line and to selectively supply inhibitor gas to the processing chamber;
    a plasma generator configured to selectively generate inhibitor plasma in the processing chamber; and
    a controller configured to control (i) an output of the gas source via at least one valve, and (ii) the plasma generator, wherein the controller is further configured to:
        perform a first ALD cycle in the processing chamber to deposit film on the substrate;
        after the first ALD cycle, expose the substrate in the processing chamber to the inhibitor plasma generated using the inhibitor gas to create a varying passivated surface in the feature; and
        after creating the varying passivated surface in the feature, perform a second ALD cycle in the processing chamber to deposit film on the substrate.

2. The substrate processing system of claim 1, wherein the controller is configured to expose the substrate to the inhibitor plasma prior to performing the first ALD cycle.

3. The substrate processing system of claim 1, wherein during the first ALD cycle and the second ALD cycle, the controller is configured to:
    expose the substrate to a first reactant;
    evacuate reactants from the processing chamber after exposing the substrate to the first reactant;
    expose the substrate to a second reactant that is different than the first reactant; and
    evacuate reactants from the processing chamber after exposing the substrate to the second reactant.

4. The substrate processing system of claim 1, wherein the film includes silicon dioxide.

5. The substrate processing system of claim 1, wherein when exposing the substrate to the inhibitor plasma, the controller is configured to:
    supply an inhibitor gas;
    strike the inhibitor plasma prior to performing the first ALD cycle;
    maintain the inhibitor plasma in the processing chamber while performing the second ALD cycle; and
    after the film is deposited on the substrate during the second ALD cycle, turn the inhibitor plasma off.

6. The substrate processing system of claim 1, wherein the inhibitor plasma inhibits subsequent film deposition in an increasing manner in the feature as a depth of the feature decreases.

7. The substrate processing system of claim 1, wherein the inhibitor plasma is created using molecular nitrogen as the inhibiting gas.

8. The substrate processing system of claim 1, wherein the controller is further configured to expose the substrate to the inhibitor plasma and perform additional ALD cycles after the second ALD cycle to bottom-up fill the feature without a seam.

9. The substrate processing system of claim 1, wherein the inhibitor gas is selected from a group consisting of molecular hydrogen, helium, argon, ammonia or combinations thereof.

10. The substrate processing system of claim 1, wherein the feature has an aspect ratio that is greater than 4:1 and an opening that is less than or equal to 30 nanometers.

11. The substrate processing system of claim 1, wherein the inhibitor plasma is generated using a first plasma source and the first ALD cycle is performed using the first plasma source.

12. The substrate processing system of claim 1, wherein the inhibitor plasma is generated using a first plasma source and the first ALD cycle is performed using a second plasma source that is different than the first plasma source.

13. The substrate processing system of claim 1, wherein the inhibitor plasma is generated using a first plasma source and the first ALD cycle and the second ALD cycle are performed without using plasma.

14. The substrate processing system of claim 1, further comprising performing one or more ALD cycles prior to the first ALD cycle without using inhibitor plasma therebetween.

15. The substrate processing system of claim 1, further comprising using a process that is different than the first ALD cycle and the second ALD cycle to fill at least part of the feature with a material after performing the first ALD cycle and the second ALD cycle.

16. The substrate processing system of claim 15, wherein:
the first ALD cycle and the second ALD cycle deposit dielectric film; and
the material includes another dielectric film that is different than the dielectric film.

17. The substrate processing system of claim 15, wherein the material includes metal.

18. The substrate processing system of claim 1, wherein the feature includes a trench.

19. The substrate processing system of claim 1, wherein the feature includes a hole.

* * * * *